United States Patent
Yu et al.

(10) Patent No.: US 8,148,732 B2
(45) Date of Patent: Apr. 3, 2012

(54) CARBON-CONTAINING SEMICONDUCTOR SUBSTRATE

(75) Inventors: Chen-Hua Yu, Hsin-Chu (TW);
Chia-Lin Yu, Sigang (TW); Ding-Yuan Chen, Taichung (TW); Wen-Chih Chiou, Miaoli (TW); Hung-Ta Lin, Hsin-Chu (TW)

(73) Assignee: Taiwan Semiconductor Manufacturing, Co., Ltd., Hsin-Chu (TW)

( * ) Notice: Subject to any disclaimer, the term of this patent is extended or adjusted under 35 U.S.C. 154(b) by 160 days.

(21) Appl. No.: 12/509,339

(22) Filed: Jul. 24, 2009

(65) Prior Publication Data
US 2010/0051965 A1    Mar. 4, 2010

Related U.S. Application Data

(60) Provisional application No. 61/093,105, filed on Aug. 29, 2008.

(51) Int. Cl.
*H01L 33/00* (2010.01)
(52) U.S. Cl. .................. 257/79; 257/E33.055
(58) Field of Classification Search .............. 257/79–81, 257/40; 118/726
See application file for complete search history.

(56) References Cited

U.S. PATENT DOCUMENTS

| | | | | |
|---|---|---|---|---|
| 5,895,938 A * | 4/1999 | Watanabe et al. | ............... | 257/77 |
| 5,920,080 A * | 7/1999 | Jones | ............... | 257/40 |
| 6,067,309 A * | 5/2000 | Onomura et al. | ......... | 372/46.01 |
| 7,145,180 B2 * | 12/2006 | Shinohara et al. | .............. | 257/85 |
| 7,503,975 B2 * | 3/2009 | Yamazaki et al. | ............... | 117/4 |
| 7,741,632 B2 * | 6/2010 | Xiong et al. | ................. | 257/13 |
| 7,880,178 B2 * | 2/2011 | Koda et al. | ........... | 257/82 |
| 7,888,669 B2 * | 2/2011 | Namkoong et al. | ............. | 257/13 |
| 2003/0219918 A1 * | 11/2003 | Shinohara et al. | ............. | 438/22 |
| 2004/0217343 A1 * | 11/2004 | Chang et al. | ................. | 257/25 |
| 2004/0218655 A1 * | 11/2004 | Tandon et al. | .................. | 372/96 |
| 2004/0245540 A1 * | 12/2004 | Hata et al. | ............... | 257/99 |
| 2004/0262593 A1 * | 12/2004 | Taylor et al. | ................... | 257/13 |
| 2006/0158101 A1 * | 7/2006 | Camilletti et al. | ............ | 313/504 |
| 2007/0228382 A1 * | 10/2007 | Yamazaki et al. | ............. | 257/72 |
| 2008/0073664 A1 * | 3/2008 | Hata et al. | ............... | 257/99 |
| 2010/0032718 A1 * | 2/2010 | Yu et al. | ................. | 257/200 |
| 2010/0035407 A1 * | 2/2010 | Goto et al. | ................... | 438/458 |
| 2010/0044719 A1 * | 2/2010 | Yu et al. | .......................... | 257/76 |

FOREIGN PATENT DOCUMENTS

| | | |
|---|---|---|
| CN | 1778002 A | 5/2006 |
| JP | 09-092883 | 4/1997 |
| WO | WO 2004/079781 A2 | 9/2004 |

* cited by examiner

*Primary Examiner* — Nathan Ha
(74) *Attorney, Agent, or Firm* — Slater & Matsil, L.L.P.

(57) ABSTRACT

A light-emitting diode (LED) device is provided. The LED device is formed on a substrate having a carbon-containing layer. Carbon atoms are introduced into the substrate to prevent or reduce atoms from an overlying metal/metal alloy transition layer from inter-mixing with atoms of the substrate. In this manner, a crystalline structure is maintained upon which the LED structure may be formed.

20 Claims, 1 Drawing Sheet

CARBON-CONTAINING SEMICONDUCTOR SUBSTRATE

This application claims the benefit of U.S. Provisional Application Ser. No. 61/093,105, filed on Aug. 29, 2008, entitled "Carbon-Containing Semiconductor Substrate," which application is hereby incorporated herein by reference.

TECHNICAL FIELD

This invention relates generally to semiconductor device manufacturing processes, and more particularly to forming light-emitting devices on carbon-containing substrates.

BACKGROUND

Light-emitting diodes (LEDs) are manufactured by forming active regions on a substrate and by depositing various conductive and semiconductive layers on the substrate. The radiative recombination of electron-hole pairs can be used for the generation of electromagnetic radiation (e.g., light) by the electric current in a p-n junction. In a forward-biased p-n junction fabricated from a direct band gap material, such as GaAs or GaN, the recombination of the electron-hole pairs injected into the depletion region causes the emission of electromagnetic radiation. The electromagnetic radiation may be in the visible range or may be in a non-visible range. Different colors of LEDs may be created by using materials with different band gaps. Further, an LED with electromagnetic radiation emitting in a non-visible range may direct the non-visible light towards a phosphor lens or a like material type. When the non-visible light is absorbed by the phosphor, the phosphor emits a visible light.

Generally, the LED structure is formed by epitaxially growing layers of group III-V compounds such that layers of oppositely doped layers of a group III-V material are placed on either side of a light-emitting layer. During the formation of the group III-V epitaxy layer, such as a GaN layer, a dielectric layer of $SiN_x$ may form, adversely affecting the performance of the LED structure. To prevent the formation of $SiN_x$, a metal transition layer is frequently deposited over the substrate prior to forming the LED structure.

The use of a metal transition layer, however, may adversely affect the crystal structure of the epitaxial GaN layer. The high temperatures used during the epitaxial growth process may cause metal atoms of the transition layer to inter-mix with the silicon atoms of the substrate, thereby forming complex structures. The complex structures resulting from the inter-mixing of the metal atoms and the silicon atoms are generally poly-crystalline or amorphous, which do not provide a good crystalline structure upon which an epitaxial process may be used to form the LED structure.

Accordingly, there is a need for an LED device, and a method of manufacturing, such that the inter-mixing of the metal atoms and the silicon atoms is reduced or prevented.

SUMMARY OF THE INVENTION

These and other problems are generally reduced, solved or circumvented, and technical advantages are generally achieved, by embodiments of the present invention, which provides light-emitting diodes (LEDs) on a substrate having a carbon-containing layer formed therein.

In accordance with one aspect of the present invention, an LED device is provided. The LED device includes a semiconductor substrate having a carbon-containing layer on a first side. The carbon-containing layer preferably has a thickness less than about 20 μm. An LED structure is formed on the first side of the semiconductor substrate. The LED device may further include a transition layer formed between the carbon-containing layer and the LED structure. The semiconductor substrate is preferably a silicon substrate having a (111) surface orientation, though other types of substrates may be used.

In accordance with another aspect of the present invention, a method of forming an LED device is provided. The method includes providing a substrate and forming a carbon-containing layer on a first side of the substrate by, for example, implantation, diffusion, or epitaxy. Thereafter, an LED structure is formed over the first side of the substrate.

In accordance with yet another aspect of the present invention, a method of forming an LED device is provided. The method includes providing a substrate and placing carbon atoms into a first side of the substrate. Thereafter, a transition layer is formed over the substrate and an LED structure is formed over the transition layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A novel method for forming light-emitting diodes (LEDs) and the resulting structures are provided. The intermediate stages of manufacturing preferred embodiments of the present invention are illustrated. It should be understood that steps necessary to illustrate the inventive aspects of the invention are shown, but other processes may be performed. Throughout the various views and illustrative embodiments of the present invention, like reference numbers are used to designate like elements.

Figure 1:
FIGS. 1-4 illustrate various intermediate process steps of manufacturing a light-emitting diode device in accordance with an embodiment of the present invention.

FIGS. 1-4 illustrate various intermediate process steps of forming a LED formed on a carbon-containing substrate in accordance with an embodiment of the present invention. Referring first to FIG. 1, a substrate 102 is provided. The substrate 102 is preferably a silicon-based substrate and may be either a conductive substrate or a non-conductive substrate. In an embodiment, a bulk silicon semiconductor substrate having a (111) surface orientation, either conductive or non-conductive, is utilized. Whether a conductive substrate or a non-conductive substrate is used may be dependent in part upon the type of electrical contacts to be utilized to contact the conductive layers of the LED structure formed in subsequent processing steps. For example, in embodiments in which a backside contact will be utilized for the lower contact layer of the LED structure, then it is preferred that the substrate 102 be conductive or doped. In other embodiments in which a front-side contact is utilized to provide an electrical contact to the lower contact layer of the LED structure, an undoped substrate 102 may be used.

It should be noted that while embodiments of the present invention are described in the context of using a bulk silicon substrate, other substrates may be used. For example, silicon-on-insulator (SOI) substrates, sapphire substrates, SiC substrates, SiGe substrates, and the like, conductive or non-conductive, may also be used. Embodiments of the present invention, however, may be particularly suited to silicon substrates due to the low cost in addition to reducing the residual stress in the LED structure formed thereon. Furthermore, while a substrate having a (111) surface orientation is preferred, substrates having a different surface orientation, such as (110) or (100) surface orientations, may also be used.

Preferably, the substrate 102 is subjected to a cleaning process to remove contaminants and to prepare the surface of the substrate 102 for subsequent processing steps. One type of cleaning process that may be used is a two-step cleaning process. A first cleaning step is performed by immersing the substrate 102 in a bath of $NH_4OH/H_2O_2/H_2O$ for about 10 minutes to remove particles and organic contaminants. A second cleaning step is performed using a mixture of $HCl/H_2O_2/H_2O$ for about 10 minutes to remove metallic contaminants. In alternative embodiments, native oxide can optionally be removed, for example, using diluted hydrofluoric acid (DHF). Other cleaning solutions, times, and the like may be used. Furthermore, other cleaning processes, such as plasma ashing, or the like may also be used.

Figure 2:
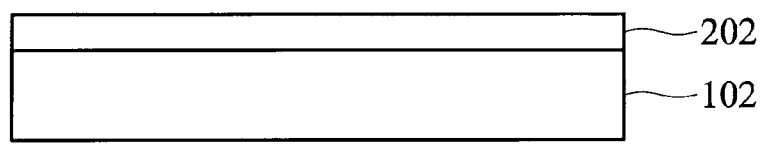

FIG. 2 illustrates forming a carbon-containing layer 202 in the substrate 102 in accordance with an embodiment of the present invention. It has been found that utilizing a silicon-based substrate having a carbon-containing layer as a substrate for an LED device may improve the quality, performance, and reliability of the LED device. In particular, it has been found that a carbon-containing layer, such as the carbon-containing layer 202, prevents or reduces the silicon atoms of the substrate and metal atoms of the overlying LED structure from inter-mixing, thereby improving the group III-nitride crystal quality. The improved group III-nitride crystal quality in turn may improve the performance and reliability of the LED device. In an embodiment, the carbon-containing layer 202 is positioned along the surface of the substrate 102 and extends to a depth of less than about 20 μm. In addition to carbon, other atoms, such as Si, Ge, and the like, may optionally be introduced into the substrate.

In an embodiment, the carbon-containing layer 202 is formed by ion implantation. For example, the carbon-containing layer 202 may be formed by implanting carbon ions at a dose of about 1E14 to about 5E15 atoms/cm$^2$ and at an energy of about 1 to about 10 KeV. Other process conditions may be used.

In another embodiment, the carbon-containing layer 202 may be formed by diffusion techniques. In this embodiment, for example, carbon-containing layer 202 may be formed by diffusing carbon at a $CH_4$ flow of about 10 to about 500 sccm, and at a temperature of about 400° C. to about 900° C. for a duration of about 1 minute to about 30 minutes. Other processes, such as an epitaxial process, may be used to form the carbon-containing layer 202.

After forming the carbon-containing layer 202, an annealing process is preferably performed to activate the carbon causing the carbon to bond with the silicon of the substrate 102. In an embodiment, the annealing process is performed at a temperature between about 500° C. and 1000° C. for a duration of about 1 second to about 30 minutes. The annealing process is preferably performed in an ambient of Ar, He, $N_2$ with a gas pressure of about 1 torr to about 760 torr. Alternatively, other annealing processes, such as a flash anneal, a laser anneal, a rapid thermal anneal, or the like may be used.

Figure 3:
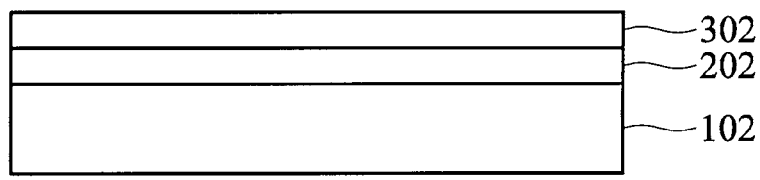

Thereafter, as illustrated in FIG. 3, a transition layer 302 is formed over the carbon-containing layer 202 in accordance with an embodiment of the present invention. The transition layer 302 may be a metal, such as Al, Ti, Ag, or the like, or a metal alloy, such as Ti—Al. The transition layer 302 has a thickness that is preferably between about 1 nm and about 100 nm.

It has been found that forming the carbon-containing layer 202 prevents or reduces the inter-mixing of the metal or metal alloys of the overlying transition layer 302 with the atoms of the substrate 102. Because the inter-mixing of the atoms of the metal or metal alloy of the transition layer 302 is prevented or reduced, a better crystalline structure is maintained for the epitaxial growth of group III-V layers of the LED structure. As a result, an LED structure having a better crystal quality may be obtained, thereby improving the performance and reliability of the LED structure.

Figure 4:
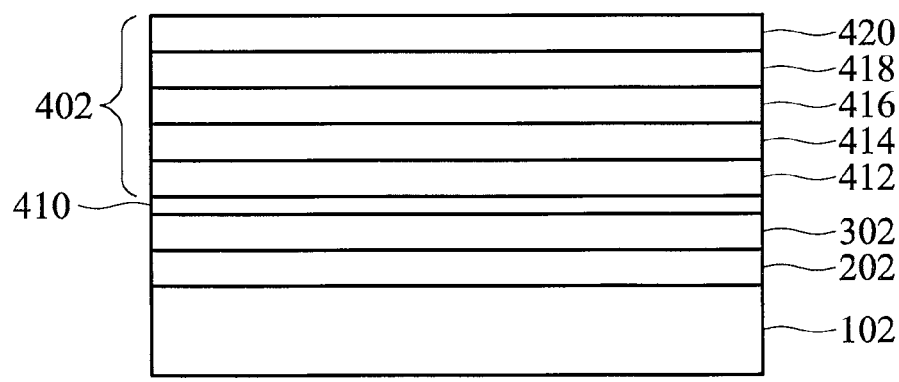

FIG. 4 illustrates forming an LED structure 402 over the transition layer 302 in accordance with an embodiment of the present invention. The LED structure 402 may comprise any suitable structure for a particular application. In an embodiment, the LED structure 402 comprises a buffer/nucleation layer 410, a first contact layer 412, a first cladding layer 414, an active layer 416, a second cladding layer 418, and a second contact layer 420.

Optionally, another annealing process is performed after the transition layer 302 is formed and prior to the forming of the LED structure 402 to remove any contaminants from the formation of the transition layer 302. The annealing process may be performed, for example, in a metal organic chemical mechanical deposition (MOCVD) reaction chamber at a temperature between about 1000° C. and 1200° C. for a duration of about 1 minute to about 30 minutes in an ambient of $N_2$, $H_2$ with a gas pressure of about 1 torr to about 760 torr. Alternatively, other annealing processes, such as a flash anneal, a laser anneal, a rapid thermal anneal, or the like may be used.

The buffer layer 410 comprises one or more layers of a conductive material formed over transition layer 302 and acts as a nucleation layer for the subsequent layers of the LED structure 402. Depending upon the type of substrate and the connections to the first and second contact layers 412 and 420, respectively, a buffer layer may be desirable between the first contact layer 412 and the substrate 102. For example, with some types of substrates, such as SiC and Si substrates, a buffer layer, such as AlN or AlGaN, may be desirable to aid in the epitaxial growth of a group III-N compound on the SiC substrate.

The buffer layer 410 may be formed of, for example, a group III-N based material, a metal nitride, a metal carbide, a metal carbon-nitride, a pure metal, a metal alloy, silicon-containing material, or the like formed by, for example, MOCVD, metal organic vapor phase epitaxy (MOVPE), plasma-enhanced CVD (PECVD), remote plasma enhanced CVD (RP-CVD), molecular beam epitaxy (MBE), hydride vapor phase epitaxy (HVPE), liquid phase epitaxy (LPE), chloride VPE (Cl-VPE), or the like. Examples of materials that may be used for the buffer layer 410 include GaN, InN, AlN, InGaN, AlGaN, AlInN, AlInGaN, and the like. As discussed above, the buffer layer 410 may include a plurality of layers, such as a plurality of AlN layers and a plurality of silicon-doped GaN layers stacked in an alternating pattern. Buffer layer 410 may be doped with a p-type or an n-type impurity, or substantially un-doped. As a result, buffer layer 410 may be of p-type, n-type, or substantially neutral.

The first contact layer 412 is formed over the buffer layer 410. The first contact layer 412 may be formed of a doped or undoped group III-nitride (or other group V element). In an embodiment, the first contact layer 412 is formed of a group III-N compound with an n-type conductivity (e.g., n-GaN) and disposed by, for example, an epitaxial growth process such as a MBE, MOCVD, HVPE, LPE, or the like. The group III-N material may include, for example, GaN, InN, AlN, $In_xGa_{(1-x)}N$, $Al_xGa_{(1-x)}N$, $Al_xIn_yGa_{(1-x-y)}N$, or the like. Other materials, including other group V elements instead of nitride, may be used.

The first cladding layer 414 is formed over the first contact layer 412. Similar to the first contact layer 412, the first cladding layer 414 may be formed of a group III-N compound (or other group V element). In an exemplary embodiment, the first cladding layer 414 comprises a group III-N compound having an n-type conductivity (e.g., n-AlGaN). The formation methods of the first cladding layer 414 may be essentially the same as the method for forming first contact layer 412.

The light-emitting layer 416 (also sometimes referred to as an active layer) is formed on first cladding layer 414. The light-emitting layer 416 may include a homojunction, heterojunction, single-quantum well (SQW), multiple-quantum well (MQW), or the like structure. In an exemplary embodiment, light-emitting layer 416 comprises undoped n-type gallium indium nitride ($In_xGa_{(1-x)}N$). In alternative embodiments, light-emitting layer 416 includes other commonly used materials such as $Al_xIn_yGa_{(1-x-y)}N$. In yet other embodiments, light-emitting layer 416 may be a multiple quantum well including multiple well layers (such as InGaN) and barrier layers (such as GaN) allocated in an alternating pattern. Again, the formation methods include MOCVD, MBE, HVPE, LPE, or other applicable CVD methods. The total thickness of the light-emitting layer 416 is preferably between about 5 nm and about 200 nm.

The second cladding layer 418 is formed on light-emitting layer 416. In an embodiment, the second cladding layer 418 comprises a material similar to that of the first cladding layer 414, such as AlGaN, except the second cladding layer 418 is doped to an opposite type of conductivity, such as p-type. The formation method of the second cladding layer 418 may be essentially the same as the method for forming the first cladding layer 414.

The second contact layer 420 is formed on the second cladding layer 418. The second contact layer 420 may be formed of essentially the same or different materials, and using similar methods, as the formation of first contact layer 412. The conductivity type of the second contact layer 420 is opposite to that of the first contact layer 412.

It should be noted that the embodiments discussed in the preceding paragraphs assume a p-side up LED structure in which the p-doped group III-N materials are on the upper surfaces, e.g., the second cladding layer 418 and the second contact layer 420, for illustrative purposes only. One of ordinary skill in the art will realize that embodiments of the present invention may also be advantageously applied to n-side up LED structures.

Furthermore, the first contact layer 412, the first cladding layer 414, the second cladding layer 418, and the second contact layer 420 may be formed of different materials and/or combinations of materials doped to a desirable p-type or n-type. It should be further noted that embodiments may utilize only one of the contact layers and the cladding layers for either or both of the upper and lower contact/cladding layers.

Thereafter, processes may be performed to complete the LED device. For example, electrical contacts (front-side and/or back-side contacts) may be formed to the first and second contact layers 412 and 420, respectively, passivation layers may be formed, and the LED device may be diced and packaged.

It should also be noted that other layers, such as a distributed Bragg reflector, may be desirable. A distributed Bragg reflector generally comprises multiple layers having different refractive indices that cause light emitted from the LED structures to be reflected, thereby increasing the light emitted from the top of the LED device. A reflective buffer layer may also be used with or in place of the distributed Bragg reflector.

The structure of the LED structures may also vary depending on the type of materials used and the intended application. It is expected that the many types of LED structures may be used with embodiments of the present invention, which provides concave recesses in a substrate in which LED structures may be formed.

In one particular example of an embodiment of the invention discussed above, a silicon substrate having a (111) surface orientation was cleaned and doped with carbon atoms by ion implantation. The substrate was annealed to activate the carbon atoms and to cause the carbon atoms to bond with the silicon atoms. A transition layer comprising Al was deposited over the carbon layer to a thickness of about 30 nm. Prior to forming the LED structure, the substrate was placed in an MOCVD reaction chamber and annealed at 1,100° C. to remove contaminants. The LED structure included a buffer layer comprising alternating layers of AlN about 3 nm in thickness and silicon-doped GaN about 6 nm in thickness deposited at about 1,300° C.; a lower contact layer comprising a silicon-doped GaN layer having a thickness of about 2 μm; a lower cladding layer comprising a silicon-doped $Al_{0.15}Ga_{0.85}N$ layer having a thickness of about 20 nm; an active layer comprising a $In_{0.15}Ga_{0.85}N$/GaN MQW layer having a thickness of about 60 nm; an upper cladding layer comprising an Mg-doped $Al_{0.15}Ga_{0.85}N$ layer having a thickness of about 30 nm; a layer of Mg-doped GaN having a thickness of about 0.1 μm; and an upper contact layer comprising an Mg-doped $Al_{0.15}Ga_{0.85}N$/GaN superlattice contact layer.

In another example of an embodiment of the invention discussed above, a silicon substrate having a (111) surface orientation was cleaned and doped with carbon atoms by diffusion. The substrate was annealed to activate the carbon atoms and to cause the carbon atoms to bond with the silicon atoms. A transition layer comprising Al was deposited over the carbon layer to a thickness of about 10 nm. Prior to forming the LED structure, the substrate was placed in an MOCVD reaction chamber and annealed at 1,100° C. to remove contaminants. The LED structure included a buffer layer comprising an AlN layer grown at low temperatures (e.g., about 550° C.) to a thickness of about 30 nm; a lower contact layer comprising a silicon-doped GaN layer having a thickness of about 3 μm; a lower cladding layer comprising a silicon-doped $Al_{0.15}Ga_{0.85}N$ layer having a thickness of about 20 nm; an active layer comprising a $In_{0.1}Ga_{0.9}N$/GaN MQW layer having a thickness of about 80 nm; an upper cladding layer comprising an Mg-doped $Al_{0.15}Ga_{0.85}N$ layer having a thickness of about 30 nm; and an upper contact layer of Mg-doped GaN having a thickness of about 0.3 μm.

It should be noted that the above examples are provided for illustrative purposes only, and accordingly, numerous other combinations and structures may be formed in other embodiments of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A light-emitting diode (LED) device comprising:
a semiconductor substrate, the semiconductor substrate having a carbon-containing layer on a first side; and
an LED structure formed on the carbon-containing layer.

2. The LED device of claim 1, further comprising a transition layer between the carbon-containing layer and the LED structure.

3. The LED device of claim 2, wherein the transition layer comprises a metal or a metal alloy.

4. The LED device of claim 3, wherein the transition layer comprises Al, Ti, Ag, Ti—Al, or a combination thereof.

5. The LED device of claim 1, wherein the carbon-containing layer has a thickness less than about 20 µm.

6. The LED device of claim 5, wherein the semiconductor substrate is a bulk silicon substrate having a surface orientation of (111).

7. A method of forming a light-emitting diode (LED) device, the method comprising:
providing a substrate;
forming a carbon-containing layer on a first side of the substrate; and
forming an LED structure over the carbon-containing layer.

8. The method of claim 7, wherein the forming the carbon-containing layer comprises implanting carbon atoms into the substrate.

9. The method of claim 7, wherein the forming the carbon-containing layer comprises diffusing carbon atoms into the substrate.

10. The method of claim 7, wherein the forming the carbon-containing layer is performed at least in part by an epitaxy process.

11. The method of claim 7, wherein the forming the carbon-containing layer comprises forming a carbon-containing layer having a thickness of less than about 20 um.

12. The method of claim 7, further comprising forming a transition layer on the carbon-containing layer prior to the forming the LED structure.

13. The method of claim 12, wherein the transition layer comprises a metal or metal alloy.

14. The method of claim 7, wherein the substrate has a (111) surface orientation.

15. A method of forming a light-emitting diode (LED) device, the method comprising:
providing a substrate, the substrate having a first side and a second side;
placing carbon atoms into the first side of the substrate;
forming a transition layer over the first side of the substrate; and
forming an LED structure over the transition layer.

16. The method of claim 15, wherein the substrate is a bulk silicon substrate having a (111) surface orientation.

17. The method of claim 15, further comprising annealing the substrate after the placing and before the forming the transition layer.

18. The method of claim 15, wherein the placing is performed at least in part by implanting carbon atoms.

19. The method of claim 15, wherein the placing is performed at least in part by diffusing carbon atoms into the substrate.

20. The method of claim 15, wherein the carbon atoms extend less than 20 um into the substrate.

* * * * *